US007012837B2

(12) United States Patent
Naura et al.

(10) Patent No.: US 7,012,837 B2
(45) Date of Patent: Mar. 14, 2006

(54) METHOD FOR ERASING/PROGRAMMING A NON-VOLATILE ELECTRICALLY ERASABLE MEMORY

(75) Inventors: David Naura, Aix en Provence (FR); Bertrand Bertrand, Trets (FR); Mohamad Chehadi, Aix en Provence (FR)

(73) Assignee: STMicroelectronics, S.A., Montrouge (FR)

( * ) Notice: Subject to any disclaimer, the term of this patent is extended or adjusted under 35 U.S.C. 154(b) by 5 days.

(21) Appl. No.: 10/903,927

(22) Filed: Jul. 31, 2004

(65) Prior Publication Data

US 2005/0207230 A1    Sep. 22, 2005

(30) Foreign Application Priority Data

Jul. 31, 2003 (FR) .................................. 03 09456

(51) Int. Cl.
*G11C 16/04* (2006.01)

(52) U.S. Cl. ............................ 365/185.19; 365/185.23

(58) Field of Classification Search ........... 365/185.19, 365/185.23, 185.28, 185.29
See application file for complete search history.

(56) References Cited

U.S. PATENT DOCUMENTS 5,978,275 A * 11/1999 Song et al. ............ 365/185.29
6,560,764 B1   5/2003 Jaengbamrung et al.

FOREIGN PATENT DOCUMENTS

| EP | 0 762 428 | 3/1997 |
| EP | 1 217 628 | 6/2002 |
| FR | 2 798 769 | 3/2001 |

* cited by examiner

*Primary Examiner*—Vu A. Le
(74) *Attorney, Agent, or Firm*—Lisa K. Jorgenson; Stephen Bongini; Fleit, Kain, Gibbons, Gutman, Bongini & Bianco, P.L.

(57) ABSTRACT

A method is provided for erasing or programming at least one memory cell of a non-volatile memory. According to the method, a state fixation pulse is applied to a floating gate transistor of the memory cell. The state fixation pulse also includes, successively, a portion at a reference voltage, and a state fixation portion at a voltage with sufficient amplitude for the transfer of electrons between the drain and the gate of the floating gate transistor. Additionally, an external adjustment signal is applied to the memory to adjust the state fixation portion to a predetermined duration, and the state fixation portion is adjusted to the predetermined duration in real time as a function of the state of the adjustment signal. Also provided is a non-volatile memory.

19 Claims, 10 Drawing Sheets

STATE OF
THE ART

STATE OF
THE ART

METHOD FOR ERASING/PROGRAMMING A NON-VOLATILE ELECTRICALLY ERASABLE MEMORY

CROSS-REFERENCE TO RELATED APPLICATIONS

This application is based upon and claims priority from prior French Patent Application No. 03 09456, filed Jul. 31, 2003, the entire disclosure of which is herein incorporated by reference.

BACKGROUND OF THE INVENTION

1. Field of the Invention

The present invention relates to methods for erasing/programming a non-volatile electrically erasable memory, and more particularly to methods for opening the programming window of a non-volatile electrically erasable memory, such as an EEPROM or Flash memory.

2. Description of Related Art

EEPROM and Flash memories use floating gate transistors. A memory cell in a conventional EEPROM memory thus comprises a floating gate transistor (FIG. 1a) that includes a control gate 101, a floating gate 102, a source region 103, a drain region 104, an oxide layer 105 and a substrate region 106. The gate is said to be "floating" since it does not have any contact with the exterior that imposes a potential on it. The thickness of the oxide 105 between the floating gate 102 and the substrate region 106 is typically on the order of a few nanometers. This reduced thickness enables the passage of electrons by the tunnel effect.

In order to erase the cell, a high voltage is typically applied on the control gate 101 and a zero voltage is applied on the drain 104. The electrical field created causes electrons to migrate to the floating gate 102 by the tunnel effect. Electrons are then trapped on the floating gate. The cell is programmed by applying a high voltage to the drain 104 and a zero voltage to the control gate 101. The floating gate thus discharges.

Conventionally, the cells of an EEPROM memory are tested at the end of the manufacturing process, particularly by carrying out endurance tests. To enable these tests, a step is carried out to open the memory cell programming window. At the end of the manufacturing process, cells are in a blank state with charges included in the oxide of the floating gate transistor of the cell, which reduces the efficiency at which cells in service can be programmed or erased. Opening the memory cell programming window involves carrying out a sequence of memory cell erase/programming cycles in order to eliminate all charges from the oxide.

An EEPROM memory is provided with internal circuits that fix the programming or erasing time and voltage of the cells in a pre-defined manner. Conventionally, these circuits are activated to perform a series of erase/programming cycles for a predetermined total time. Thus, assuming that the cell programming time is 10 milliseconds, about a hundred cycles are carried out to obtain an exemplary window opening time of 1 second.

Voltages applied to the drain or to the control gate are generated by a state fixation voltage generator. FIG. 1b contains a timing diagram of the voltages generated by such a generator during an exemplary cell erase/programming cycle. A first erase pulse 110 comprises four phases:

1) a plateau 111 at a memory power supply voltage Vcc;
2) an increasing voltage ramp 112 between the voltage Vcc and a programming or erase voltage P, with a duration of 1 ms in this example, with the slope of the ramp being determined such that the electric field between the drain 104 and the floating gate 102 does not vary too quickly, so as not to deteriorate the cell;
3) a plateau 113 at the programming or erase voltage P, with a duration of 1 ms in this example; and
4) a falling front 114 during which the voltage P returns to the power supply value Vcc.

A consecutive programming step 210 comprises corresponding phases 211 to 214 that are identical to the phases in the erase step.

The generator pulses are applied selectively to the drain during programming, or to the gate of the floating gate transistor during erasing.

This type of EEPROM memory and window opening method have disadvantages. For example, for a given window opening time, the number of erase/write cycles to be made varies as a function of the cell programming time defined by the memory circuitry. For a given technology, different EEPROM memory series may have different programming times. Therefore the number of cycles in the method needs to be adapted to the programming time of each series, which makes this window opening step painstaking. The window opening step is done on several memories in parallel (for example, 8, 16 or 32), so consequently cell programming times have to be tested to determine the number of erase/write cycles to be applied.

Other disadvantages also appear from the user's point of view. For example, the programming time for memories in a particular series is variable, since it depends on contingencies in the manufacturing method. Memories in a particular series may thus have a completely different behavior due to these different programming times.

Moreover, internal circuits fixing the cell programming time are fixed and define a programming time that guarantees that each cell can be correctly erased or programmed for a given number of cycles corresponding to its life. The user does not have any simple means for improving the life of the memories.

SUMMARY OF THE INVENTION

In view of these drawbacks, it is an object of the present invention to overcome these drawbacks and to provide an improved EEPROM memory and an associated control method.

Another object of the present invention is to provide a method for erasing or programming at least one memory cell of a non-volatile memory.

One embodiment of the present invention provides a method for erasing or programming at least one memory cell of a non-volatile memory. According to the method, a state fixation pulse is applied to a floating gate transistor of the memory cell. The state fixation pulse also includes, successively, a portion at a reference voltage, and a state fixation portion at a voltage with sufficient amplitude for the transfer of electrons between the drain and the gate of the floating gate transistor. Additionally, an external adjustment signal is applied to the memory to adjust the state fixation portion to a predetermined duration, and the state fixation portion is adjusted to the predetermined duration in real time as a function of the state of the adjustment signal Another embodiment of the present invention provides a non-volatile memory that includes at least one memory cell provided with a floating gate transistor, a circuit for generating pulses to fix the state of the floating gate transistor, a pin that is accessible from outside the memory, and a control circuit for the state fixation pulse generation circuit. The pulses include a portion at a reference level and a state fixation portion. The control circuit has an input coupled to the pin, and adjusts the duration of the state fixation portion in real time as a function of an adjustment signal that is applied to the pin.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1A:
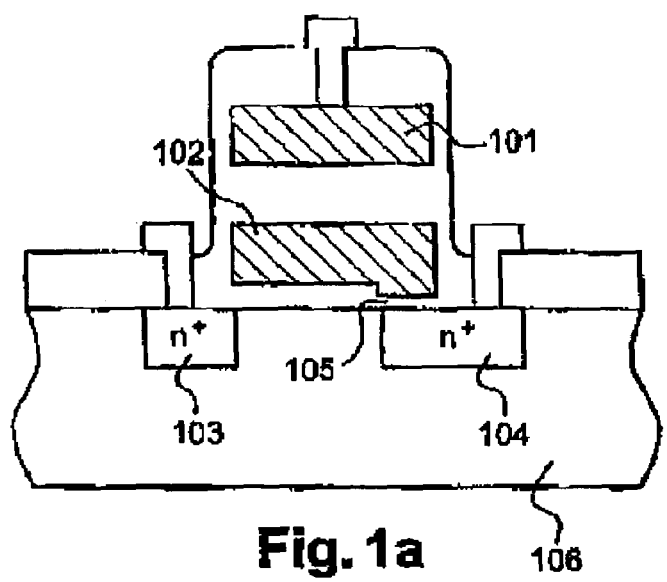
FIG. 1a is a sectional view of a conventional floating gate transistor.
Figure 1B:
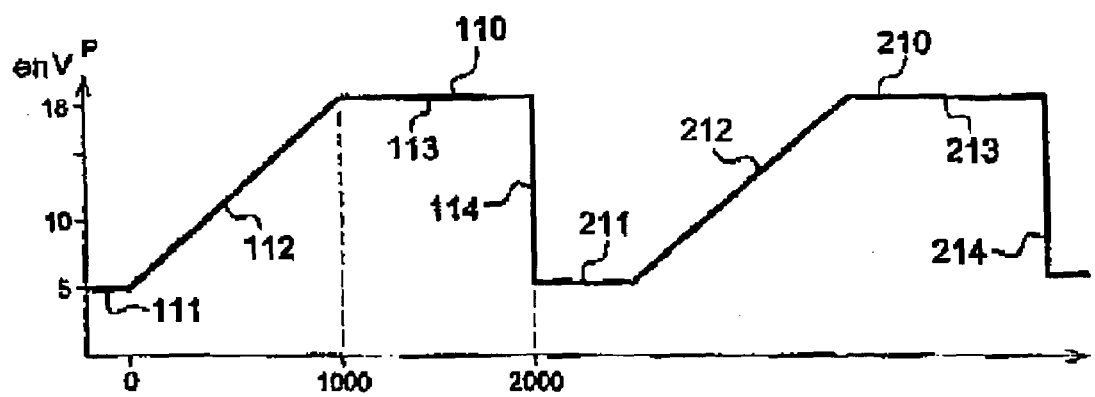
FIG. 1b is a diagram of output voltages from a pulse generator during a conventional test phase of a memory cell.

Preferred embodiments of the present invention will be described in detail hereinbelow with reference to the attached drawings.

In preferred embodiments of the present invention, the state of a non-volatile memory cell is fixed by controlling the pulse applied to the floating gate transistor from outside the memory (i.e., externally). An adjustment signal, with a predetermined duration, of a state fixation portion of the pulse is externally applied (i.e., applied from the outside), in order to extend the state fixation portion beyond the portion defined by the internal circuitry of the memory.

Thus, the preferred method for fixing the state of the memory cell of a non-volatile memory includes application of a state fixation pulse to the floating gate transistor, including the following in sequence: a portion at a reference voltage Vcc (for example illustrated by portions 111 and 211), and a portion at a state fixation voltage, with sufficient amplitude for the transfer of electrons between the drain and the gate of the floating gate transistor (for example illustrated by portions 113 and 213). These portions are conventionally separated by a ramp designed to prevent deterioration of the floating gate transistor.

According to the preferred method, an adjustment signal applied from outside the memory fixes a predetermined duration for the portion of the pulse with the state fixation voltage, in order to extend this duration beyond the value defined by the memory internal circuitry.

When the adjustment signal fixes a predetermined duration longer than an opening duration of the floating gate transistor window, the window of one or several floating gate transistors of one or several memories can be opened, independently of the programming time fixed by the internal circuitry of each memory. Application of the pulse then corresponds to a step in which the memory cell is erased, in order to charge the floating gate of the floating gate transistor. Typically, the pulse is then applied to the control gate of the floating gate transistor. The duration of the state fixation portion is then typically more than 1 second. This step may be followed by a subsequent step to apply a similar pulse. This step typically comprises application of the pulse to the drain of the floating gate transistor.

The present invention can also be used to fix the same programming time for a set of memory cells or memories from the outside. These memories can thus be controlled from the outside to present an equal programming time. Thus, a user can extend the programming time at will. Extending the programming time of the cells improves their retention behavior, which improves their life.

One preferred embodiment of the present invention provides a method for erasing or programming at least one memory cell of a non-volatile memory, with the cell including a floating gate transistor. According to the method, a state fixation pulse is applied to the floating gate transistor, with successively: a portion at a reference voltage; and a state fixation portion, at a voltage with sufficient amplitude for the transfer of electrons between the drain and the gate of the floating gate transistor. Additionally, an external signal is applied to the memory to adjust the state fixation portion to a predetermined duration, and the state fixation portion is adjusted to the predetermined duration. In one embodiment, the predetermined duration is longer than a window opening duration of the floating gate transistor.

Preferably, the pulse application step is an erase step and the pulse is applied to the gate of the floating gate transistor. In one such embodiment, the method includes a programming step following the erase step. This programming step includes a step in which a state fixation pulse is applied to the floating gate transistor, with the following in sequence: a portion at a reference voltage; and a state fixation portion, at a voltage with sufficient amplitude for the transfer of electrons between the drain and the gate of the floating gate transistor. Additionally, an external signal is applied to the memory to adjust the state fixation portion to a predetermined duration, and the state fixation portion is adjusted to the predetermined duration.

In some embodiments, the adjustment signal is applied to a ramp generation circuit that generates the state fixation pulse, with the state fixation portion being generated at least until the adjustment signal is no longer applied to the generation circuit. Preferably, the state fixation portion is a plateau.

In some embodiments, the method is applied in parallel to several memories, and the same adjustment signal is applied to all of these memories.

Another embodiment of the present invention provides a non-volatile memory that includes at least one memory cell provided with a floating gate transistor, and a circuit for generating state fixation pulses of the floating gate transistor. Each of the pulses includes a portion at a reference level and a state fixation portion. The memory also includes a pin accessible from outside the memory, and a control circuit for the state fixation pulse generation circuit with an input connected to the pin. The control circuit adjusts the duration of the state fixation portion as a function of an adjustment signal applied to the pin.

In one embodiment, the memory also includes a circuit that has an input to which state fixation pulses are applied. The circuit selectively applies these pulses to the gate or the drain of the floating gate transistor.

In some embodiments, the circuit for generating pulses comprises a capacitor charge and discharge circuit at constant current. The control circuit controls charging of the capacitor when the adjustment signal is applied, such that the state fixation pulse passes through a portion forming a ramp between the portion at a reference voltage and the state fixation portion. Preferably, the control circuit controls discharge of the capacitor when the adjustment signal is no longer applied to the pin, such that the pulse changes from the state fixation portion to another portion at a reference voltage.

Exemplary embodiments of the present invention will now be described in detail with reference to FIGS. 2–10.

Figure 2:
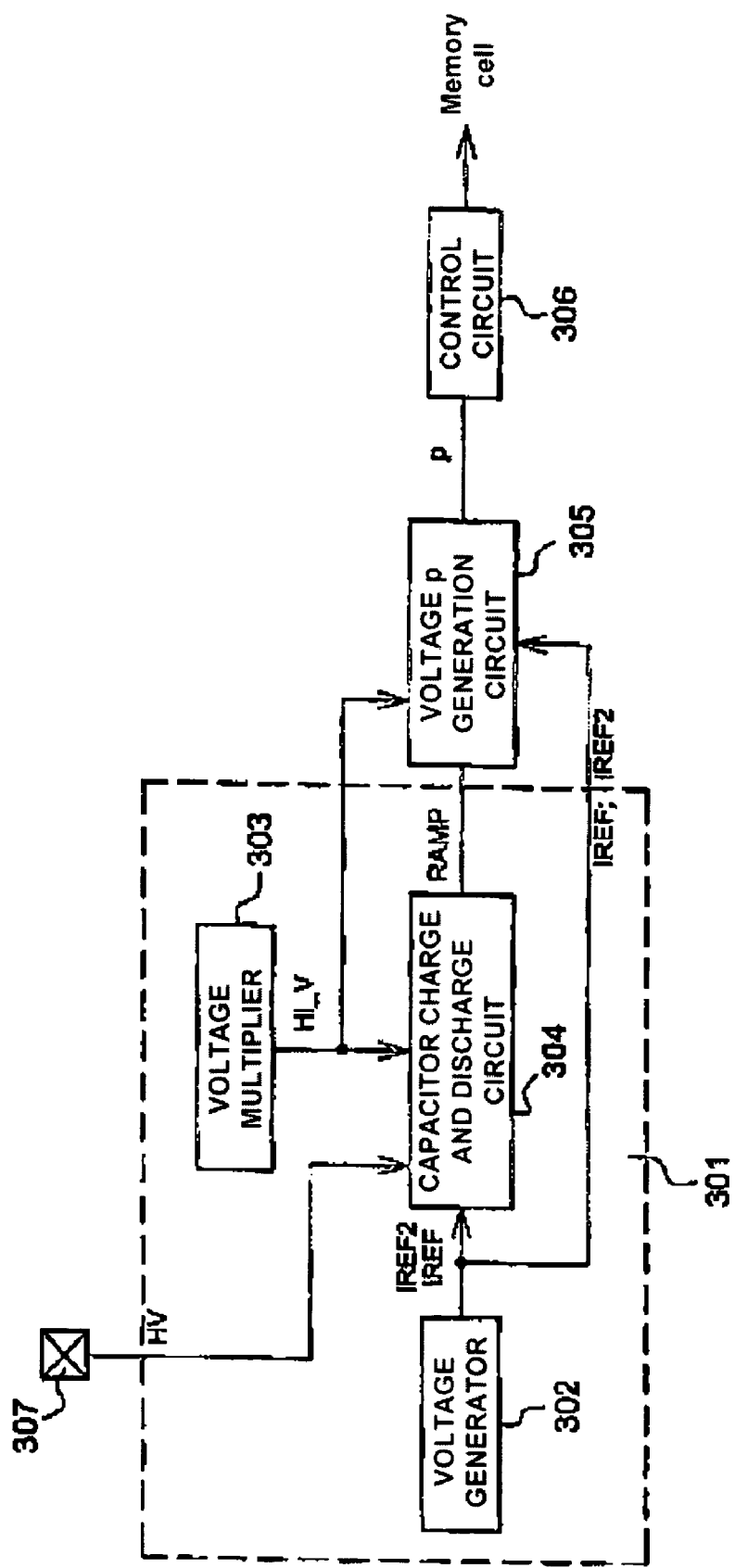
FIG. 2 is a block diagram of a state fixation circuit of a memory cell according to a preferred embodiment of the present invention.

FIG. 2 is a block diagram of a programming or erase circuit for a memory cell according to a preferred embodiment of the present invention. This circuit produces the pulse, illustrated by a programming voltage P. In this embodiment, the circuit case includes a voltage ramp generation circuit 301, a circuit 305 for generating a programming voltage or a state fixation voltage in cascade with the circuit 301 that generates the ramp to obtain the programming or state fixation voltage P, and a control circuit 306 to selectively apply the programming voltage output from circuit 305 to a memory cell. In general, the circuits 301 and 305 form a state fixation pulse generator identified by the voltage P.

The ramp generation circuit 301 comprises a current control voltage generator 302 that is stable in temperature, a voltage multiplier 303, and a capacitor charge and discharge circuit 304.

Figure 3:
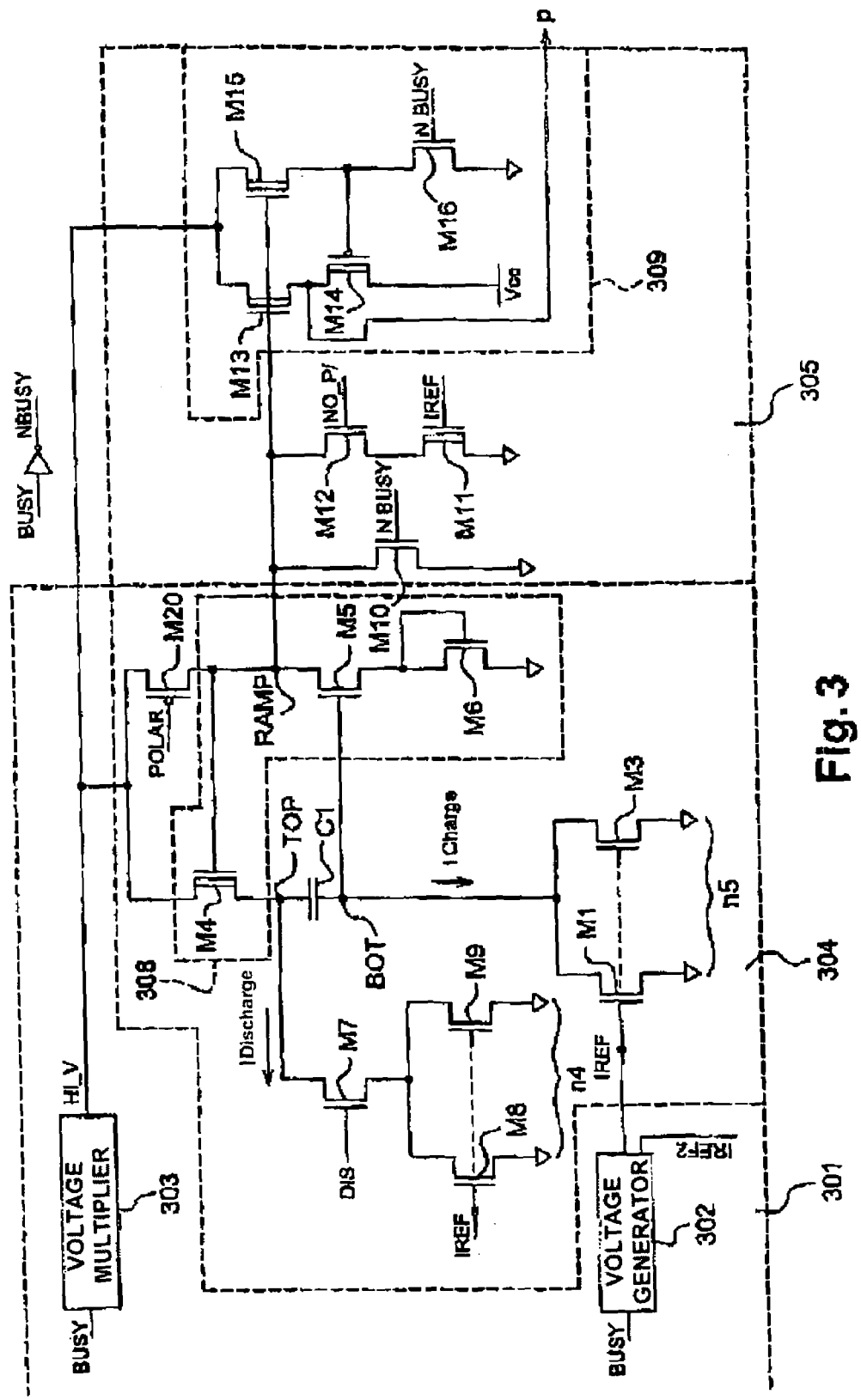
FIG. 3 is a practical exemplary embodiment of the circuit of FIG. 2.

A practical exemplary embodiment of the circuit of FIG. 2 is shown in detail in FIG. 3. For a better understanding of how the circuit operates, the circuit connections are referenced in the diagram by the signals that are carried.

The voltage generator 302 and the voltage multiplier 303 supply power (i.e., voltages IREF, IREF2 and HI_V) to the capacitor charge and discharge circuit 304, and the circuit 305 that generates the voltage P. A BUSY signal is output by a control circuit and indicates validation of a memory cell write mode and deselection of the memory (a write order typically includes application of a predetermined sequence on memory input pins followed by deselection of the memory, followed by activation of the voltage multiplier 303).

The voltage multiplier 303 outputs the voltage HI_V to the drain of a native transistor M4 in the circuit 304 and to the source of a transistor M20 in this circuit 304. A native transistor is a transistor that did not receive any complementary implantation in its conducting channel. Its conducting threshold voltage is on the order of 0.2 volts.

The voltage multiplier 303 may, for example, be a Schenkel type charging pump. Its function is to produce high voltages, for example on the order of 15 to 20 volts.

The voltage generator 302, chosen to be stable in temperature, supplies power (voltage IREF) to the gate of two transistors M1 and M3 that are arranged in parallel in the circuit 304. The sources of transistors M1 and M3 are connected to ground. The drains of transistors M1 and M3 are connected to a bottom terminal of the capacitor C1 that receives a charging current Icharge. The part of the circuit 304 comprising transistors M1 and M3 forms its charge circuit. The circuit 304 may comprise a number n5 of transistors M1 through M3 in parallel or a single transistor M1. The current I3 passing through each transistor is then defined by the relation I3=Icharge/n5.

The circuit 304 also comprises a transistor M7 for which the drain is connected to the top terminal of the capacitor C1. The source of the transistor M7 is connected to the drains of a number n4 of transistors that are connected in parallel, represented in this case by transistors M8 and M9. The voltage generator 302 supplies power (voltage IREF) to the gates of transistors M8 and M9. The sources of transistors M8 and M9 are connected to ground. The transistor M7 is controlled by the DIS signal that supplies power to its gate. The discharge current, Idischarge, is the current passing through the transistor M7. The number n4 of transistors depends on the required discharge duration.

Figure 4:
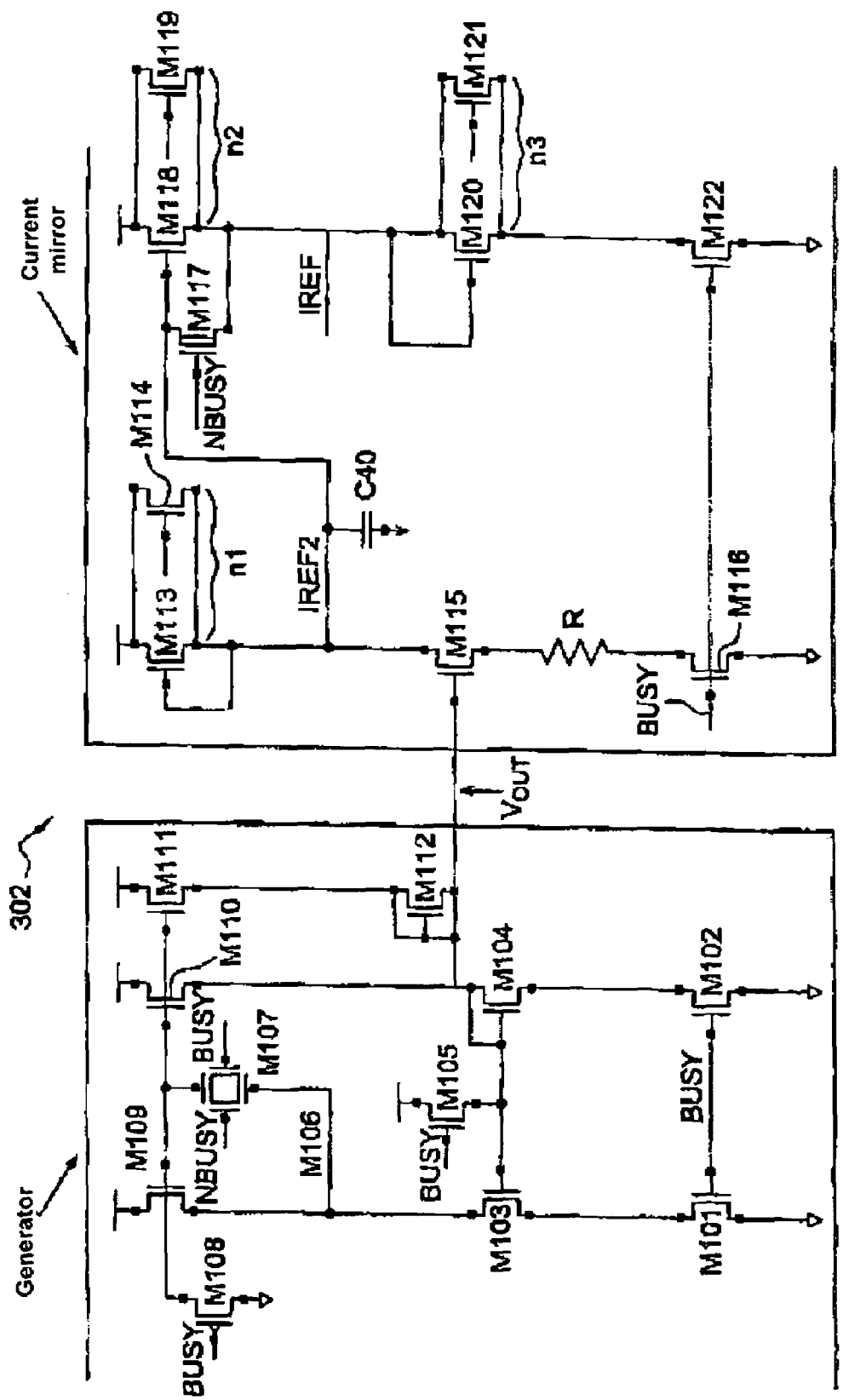
FIG. 4 is an exemplary voltage generator.

The level of the voltage IREF output by the voltage generator 302 defines the magnitude of the current Icharge and the current Idischarge, by its application on the corresponding gates of transistors M1, M3, M8 and M9. The currents Icharge and Idischarge are proportional to the value of IREF. The value of IREF and IREF2 may, for example, be on the order of Vt(n) and Vcc−Vt(p), respectively. FIG. 4 shows an example of a voltage generator 302 that can be used to generate voltages IREF and IREF2.

The transistor M20 receives a POLAR signal on its gate. The POLAR signal is a polarization voltage for transistor M20. The gate of transistor M4 is connected to the drain of transistor M20 and the source of transistor M4 is connected to the top (or first) terminal of the capacitor C1. The voltage at this top terminal is labeled TOP. The bottom (or second) terminal of the capacitor C1 is connected to the gate of a transistor M5. The voltage at this bottom terminal is labeled BOT. The capacitor C1 may, for example, be a power capacitor with a capacitance of between 5 and 10 pF.

Moreover, the drain of transistor M5 is connected to the gate of the native transistor M4 and outputs the RAMP signal, and the source of transistor M5 is connected to the gate and the drain of a transistor M6. The source of transistor M6 is connected to ground. In this circuit, the transistor M6 is used as a resistance. The assembly composed of transistors M4, M5 and M6 represents a regulation circuit 308 for the charge current of capacitor C1.

The circuit 305 that generates the voltage P receives the RAMP signal that is output from the charge and discharge circuit 304. The circuit 305 uses this RAMP signal to produce the voltage P. This voltage is then selectively applied through the circuit 306, either onto the word line of the cell to be modified, or onto its bit line depending on the required state fixation step (erase or programming).

The RAMP signal is input to the gates of two native transistors M13 and M15. The voltage multiplier 303 outputs the voltage HI_V to the drains of these two transistors. The sources of the native transistors M13 and M15 are connected to the source of the native transistor M14 and the drain of the transistor M16, respectively. All of the transistors used in the circuit in FIG. 3 are of the N type except for transistors M14 and M20. The drain of the native transistor M14 is connected to the power supply voltage Vcc of the memory. The gate of transistor M14 is connected to the drain of transistor M16. The source of the transistor M16 is connected to ground and its gate receives the NBUSY signal. The NBUSY signal corresponds to the inverted BUSY signal.

Transistors M13 to M16 form a polarization circuit 309 that imposes the power supply voltage Vcc as the reference voltage of the voltage P signal.

The circuit 305 also includes the transistor M10 connected between the RAMP output of the circuit 301 and ground, and controlled by the NBUSY signal. This transistor M10 cancels the RAMP signal when NBUSY changes to "1". The transistors M11 and M12 are connected in series between the RAMP output of the circuit 301 and ground, and are controlled by the IREF and NO_P signals, respectively. These transistors provoke the falling front of the voltage P as far as the reference voltage Vcc.

Figure 5:
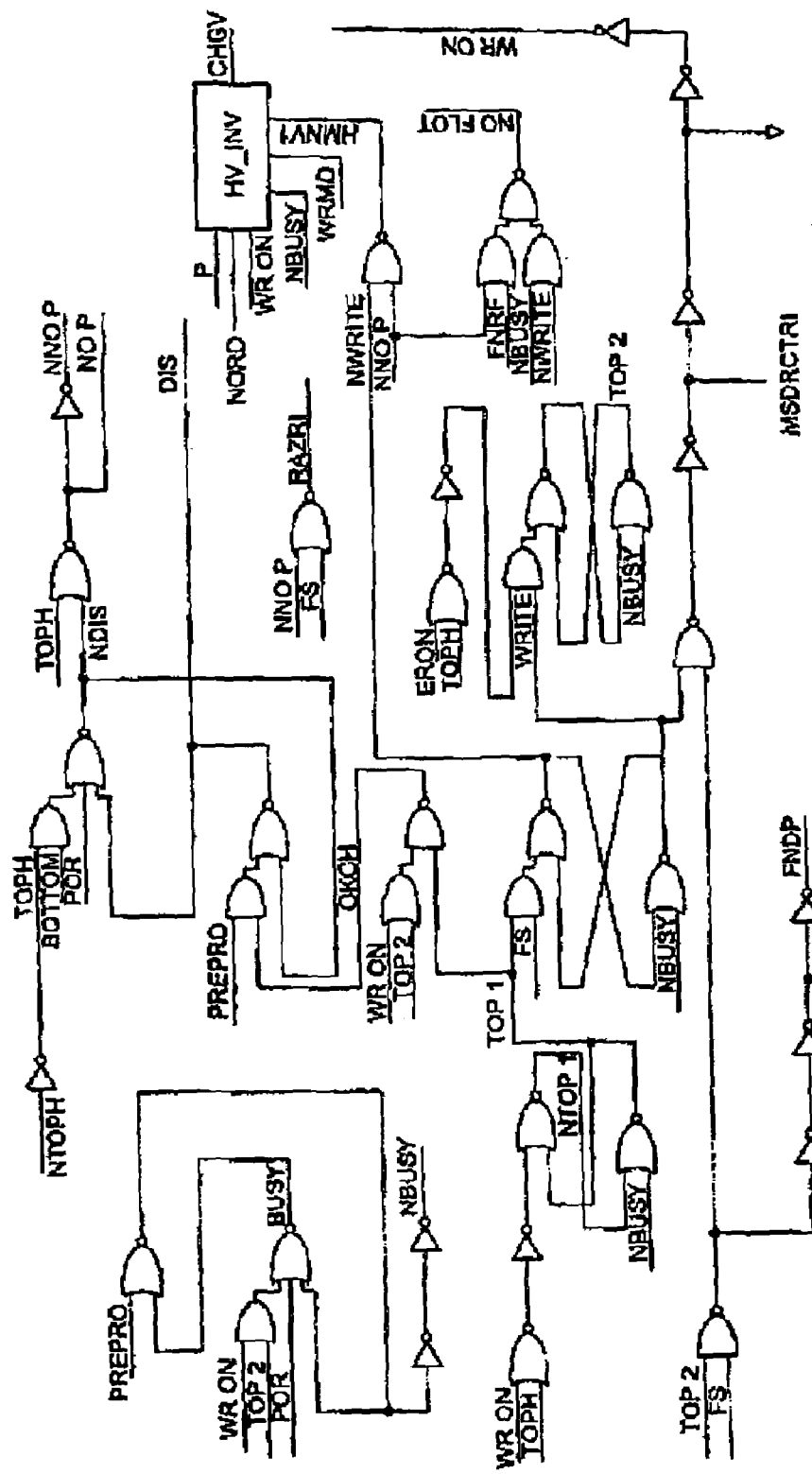
FIG. 5 is a conventional ramp control circuit.

FIG. 5 illustrates a ramp control circuit that is conventionally used by the circuit 304 and by the circuit 305 to generate the voltage P.

Figure 6:
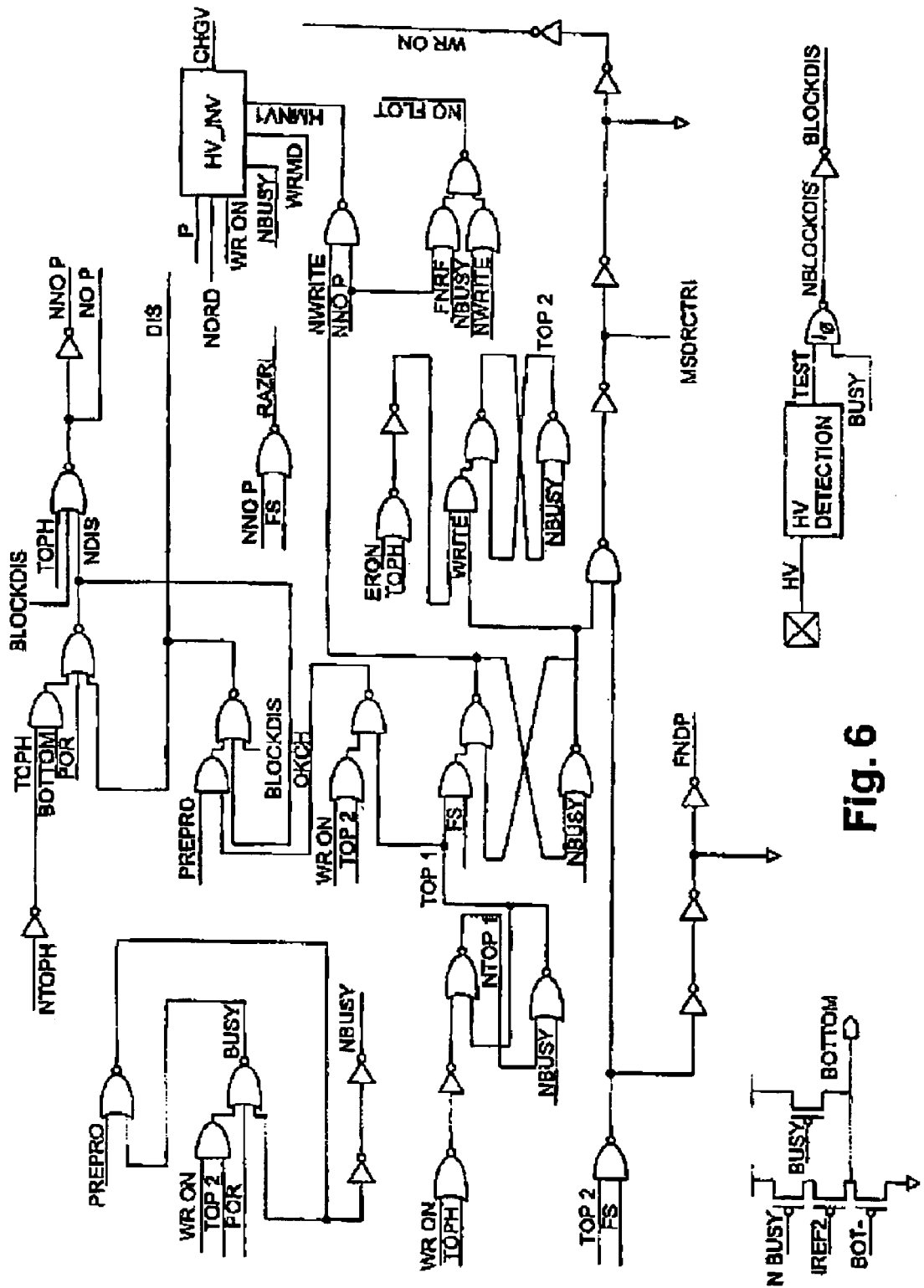
FIGS. 6 to 8 are ramp control circuits according to embodiments of the present invention.
Figure 7:
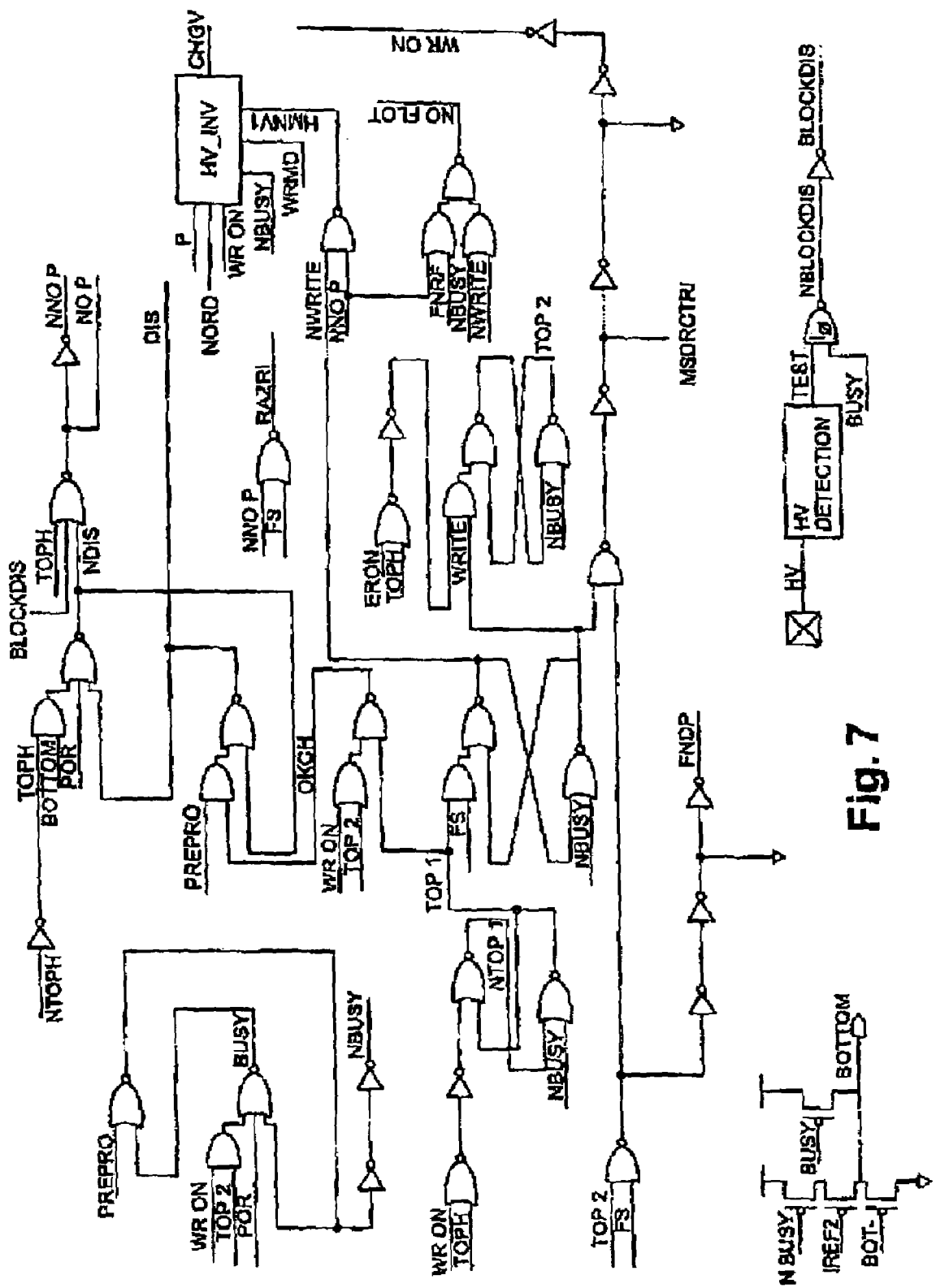
Figure 8:
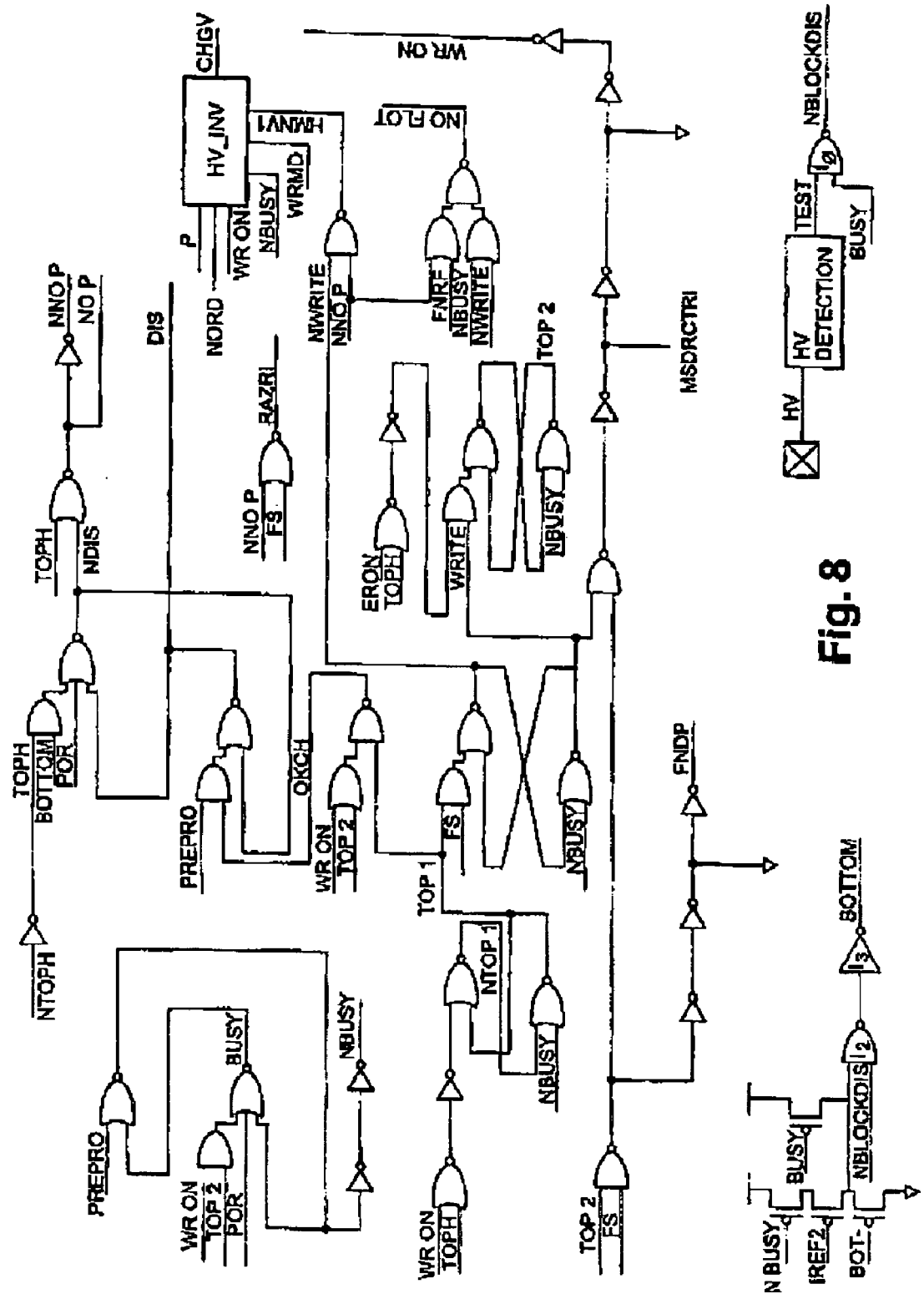

FIGS. 6 to 8 illustrate three different embodiments of a ramp control circuit according to the present invention. These circuits have additional logical gates for processing an adjustment signal HV that is applied from outside the memory.

According to preferred embodiments of the present invention, a pin 307 that is accessible from outside the memory applies the adjustment signal HV to define the duration of application of the programming voltage P at a state fixation level. For example, this adjustment signal may be a signal at a high voltage level, on the order of 10 to 12 volts. A high voltage detection circuit transforms the HV voltage into a TEST signal representing its logical image.

In the following examples, each voltage P pulse presents a first portion at the reference voltage Vcc, a second portion forming a rising ramp, a third portion adjusted from the outside and forming a plateau at a state fixation voltage, a fourth portion at the fixation voltage and generated by discharge of capacitor C1, a fifth portion forming a falling front and a sixth portion at the reference voltage Vcc.

In the circuits of FIGS. 6 and 7, the BLOCKDIS signal is applied to the input of a NOR gate with the TOPH or NDIS signals to generate the NO_P signal at the output.

Figure 9:
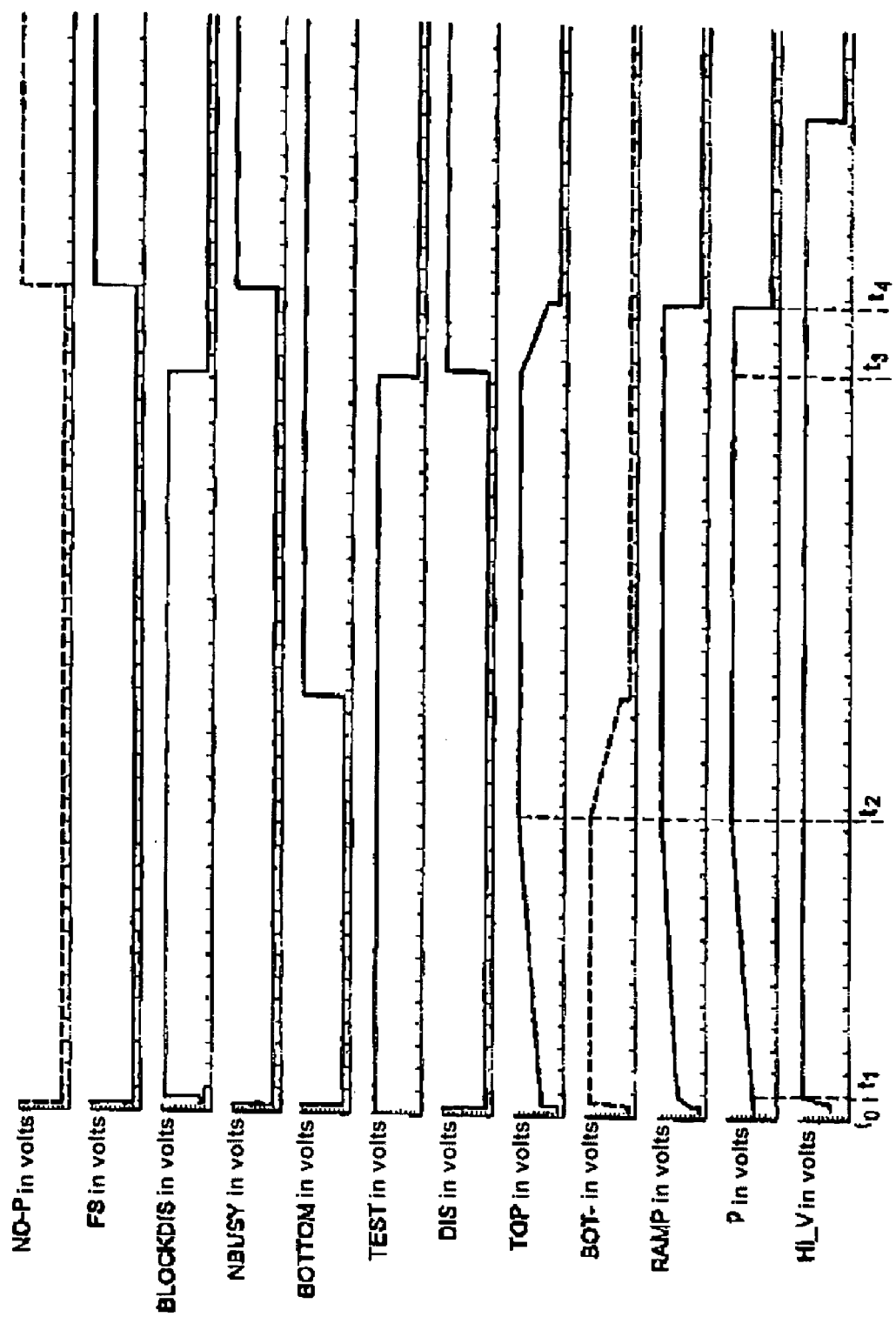
FIG. 9 is a timing diagram associated with the operation of the control circuit of FIG. 6.

The timing diagram in FIG. 9 shows a generation cycle for a pulse P in which the third portion is extended from the outside when the circuit of FIG. 6 is used.

In the circuit of FIG. 6, the PREPRO and NDIS signals are also applied to the input of an AND gate. The output from the AND gate, the NDIS signal and the BLOCKDIS signal are applied to the input of a NOR gate to generate the DIS signal at the output.

A TEST signal at high level is applied before deselection of the memory at time t0. The signal P is then in its first portion at voltage Vcc. At approximately time t1, the BUSY signal changes to the high state and thus generates a passage to the high state of HI_V. The NO_P, FS, BOTTOM and DIS signals change to the low state. The TEST and BUSY signals are applied to the input of an AND gate. The output from the AND gate generates the BLOCKDIS signal. Therefore, the BLOCKDIS signal changes to the high state at approximately time t1. As NO_P changes to the low state, it starts charging C1 at constant current.

The signal P changes to its second portion. The slope P in the second portion is proportional to the current Icharge which is approximately constant and on the order of 100 nA. P follows the rise in the RAMP signal which follows the rise in the TOP signal, through transistors M4 and M5. BOT-changes to the high state during the charging. When the capacitor C1 is charged, the RAMP signal reaches the value HI_V. The P signal then reaches the value HIV−Vt, where Vt is the threshold voltage of transistor M13.

The signal P then changes to its third portion. The BOT-signal decreases to a low state, which causes the BOTTOM signal to change to the high state. The function of the high state of the BLOCKDIS signal is to block the DIS signal and consequently the NO_P signal, as long as the TEST signal is at the high state. Blockage of the DIS signal prevents the capacitor C1 from discharging, so that the plateau of the third portion of P is maintained (if the TEST voltage is not applied, the DIS signal would have switched to the high state by following the BOTTOM signal).

At time t3, the voltage HV applied from the outside changes to the low state so that the TEST voltage and the BLOCKDIS signal change to the low state. The fourth portion of the P signal then corresponds to a classical discharge of the capacitor C1. At time t3, DIS changes to the high state and the TOP signal decreases. The DIS signal makes the transistor M8 conducting, which initiates discharge of the capacitor C1 at constant current. P then has a plateau continuous with the plateau in the third portion.

At time t4, TOP reaches a low state and changes the NO_P and FS signals to "1". The RAMP and P signals then change to the low state, corresponding to the firth portion. The P signal then begins the sixth portion at level Vcc.

Therefore, applying the HV signal on the pin 307 generates the third portion and thus adjusts the duration of a plateau formed from the third and fourth portions.

By choosing an appropriate plateau duration, for example longer than 1 second, it is possible in particular to open a window of the floating gate transistors by a single erase step terminating at instant t4.

In the example of FIG. 6, the application duration of the HV signal is globally equal to the duration between the beginning of the charge and the beginning of the discharge. The application duration of the HV signal is therefore a priori not exactly the same as the programming time, since discharge of the capacitor prolongs this programming time.

FIG. 7 shows a control circuit in which the programming time precisely corresponds to the application time of the HV signal. This circuit thus discharges at constant current before the end of application of the adjustment signal. The control circuit in FIG. 7 also has a simplified structure.

The BLOCKDIS signal in FIG. 7 is not used to generate the DIS signal.

Figure 10:
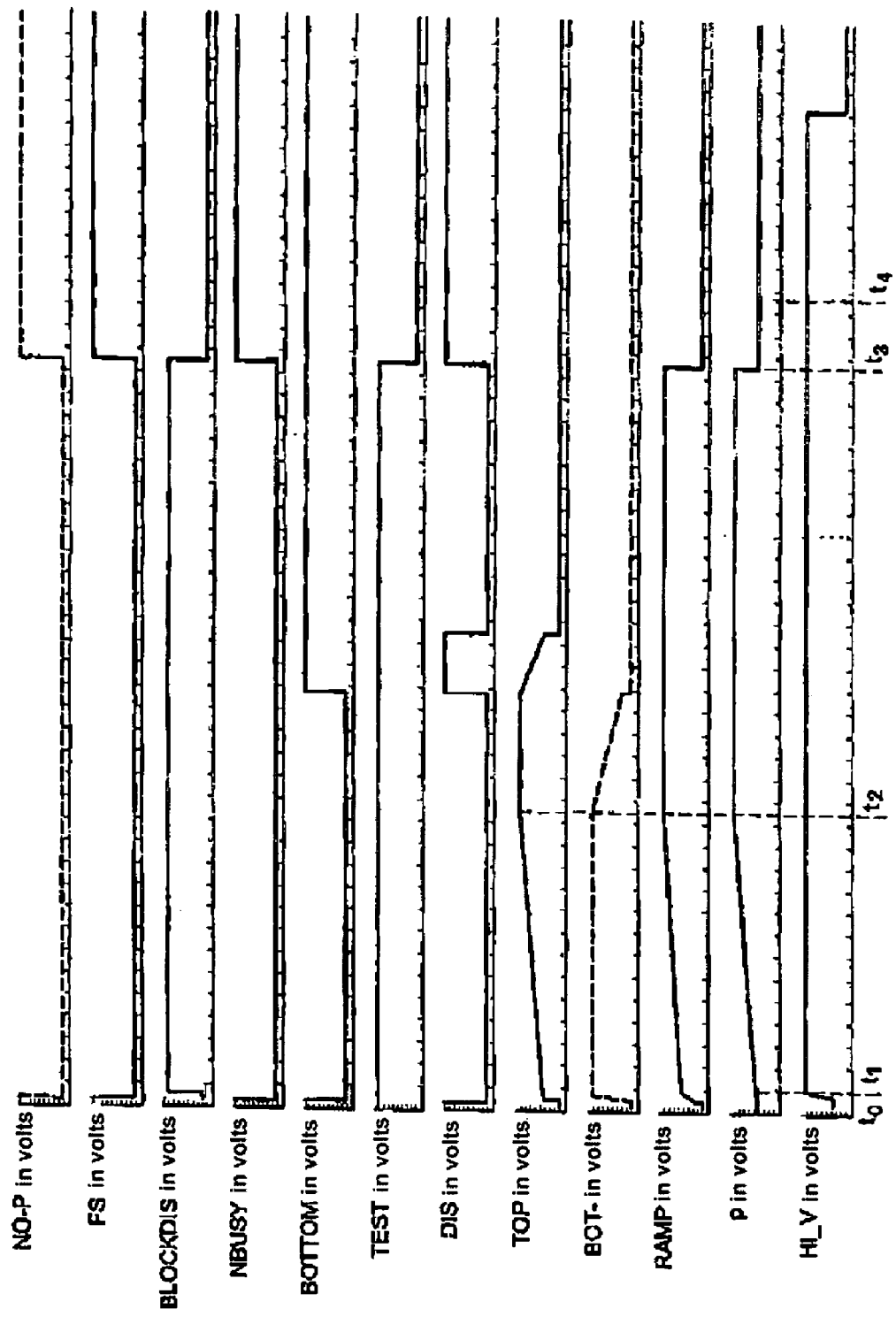
FIG. 10 is a timing diagram associated with the operation of the control circuit of FIG. 7.

The timing diagram in FIG. 10 represents a cycle generating a pulse P with the control circuit of FIG. 7. The timing diagrams in FIGS. 9 and 10 are identical until time t2.

At time t2, the capacitor C1 continues to discharge and the TOP signal continues to increase. The P signal then changes to its third portion. The BOT-signal decreases to a low state, which causes the BOTTOM signal to change to the high state. The change of the BOTTOM signal to the high state causes the DIS signal to change to the high state. The change of the DIS signal to the high state makes the capacitor C1 discharge and the TOP signal decrease. The high state of the BLOCKDIS signal blocks the change of the NO_P signal to the high state as long as the TEST signal is in the high state. The plateau of the third portion is then maintained.

At time t3, the HV voltage applied from the outside changes to the low state and implies that the TEST voltage and the BLOCKDIS signal change to the low state. Since the capacitor C1 is already discharged, the P signal returns to the falling front of the fifth portion.

The circuits of FIGS. 6 and 7 are normally designed to generate a cycle including first an erase phase followed by a programming phase controlled by the TOP2 signal.

The circuits of FIGS. 6 and 7 have other functions when the ERON and WRON signals are applied to them.

According to a first variant, the window opening step includes two cycles. During a first cycle, an extended erase phase is performed as described above, followed by a conventional programming phase (for which the duration is determined by the internal memory circuitry) in which the flip-flops have not been loaded with data to be programmed.

During the next cycle, a high state of the WRON signal is applied. During this cycle, application of the WRON signal cancels the erase phase. The next phase is an extended programming phase as described above, in which the flip-flops have been filled with data to be programmed. The duration of the erase cycle phase of the first cycle is preferably equal to the duration of the programming phase in the second cycle.

According to a second variant, the window opening step also includes two cycles. During a first cycle, an ERON signal in the high state is applied to the circuit. The first cycle then comprises an extended erase phase as described above and the programming phase with a normal duration is deleted in this first cycle. The WRON signal may be applied during the second cycle, to delete the erase phase in this cycle as described above.

For a window opening step, the programming or erase time adjusted by the external signal may also be on the order of one second.

FIG. 8 represents one exemplary embodiment of a simplified ramp control circuit in accordance with the present invention. In this circuit, the NBLOCKDIS signal is used to block the BOTTOM signal. Thus, the P signal is maintained in the third portion by preventing discharge of the capacitor C1.

The present invention is not restricted to the preferred embodiments described above. For example, it is possible to use a low voltage adjustment signal or an adjustment signal with a logical state inverted from the HV signal described above. Further, the adjustment signal may be applied to pins that are infrequently used in memories and connected to the input of the control circuit. In particular, the connections of the HOLD pin present on some EEPROM memories marketed by STMicroelectronics (the assignee of the present invention) can be appropriately modified, and an adjustment signal can then be applied to it.

The method of the present invention can be embedded in hardware, software, or a combination of hardware and software. Any processor, controller, or other apparatus adapted for carrying out the functionality described herein is suitable. A typical combination of hardware and software could include a general purpose microprocessor (or a controller) with a computer program that, when loaded and executed, carries out the functionality described herein.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method for erasing or programming at least one memory cell of a non-volatile memory, the memory cell comprising a floating gate transistor, the method comprising the steps of:
    applying a state fixation pulse to the floating gate transistor, the state fixation pulse including, successively:
        a portion at a reference voltage; and
        a state fixation portion at a voltage with sufficient amplitude for the transfer of electrons between the drain and the gate of the floating gate transistor;
    applying an external adjustment signal to the memory to adjust the state fixation portion to a predetermined duration; and
    adjusting the state fixation portion to the predetermined duration in real time as a function of the state of the adjustment signal.

2. The method according to claim 1, wherein the predetermined duration is longer than a window opening duration of the floating gate transistor.

3. The method according to claim 2, wherein the step of applying a state fixation pulse is an erase step in which the pulse is applied to the gate of the floating gate transistor.

4. The method according to claim 3, further including a programming step following the erase step, the programming step including:
    applying a state fixation pulse to the floating gate transistor, the state fixation pulse including, successively:
        a portion at a reference voltage; and
        a state fixation portion at a voltage with sufficient amplitude for the transfer of electrons between the drain and the gate of the floating gate transistor;
    applying an external signal to the memory to adjust the state fixation portion to a predetermined duration; and
    adjusting of the state fixation portion to the predetermined duration.

5. The method according to claim 1, wherein the step of applying an external adjustment signal includes the sub-step of applying the adjustment signal to a ramp generation circuit that generates the state fixation pulse, the state fixation portion being generated at least until the adjustment signal is no longer applied to the generation circuit.

6. The method according to claim 1, wherein the state fixation portion is a plateau.

7. The method according to claim 1, wherein the method is performed in parallel on several memories, and the same adjustment signal is applied to all of the memories.

8. A non-volatile memory comprising:
    at least one memory cell provided with a floating gate transistor;
    a circuit for generating pulses to fix the state of the floating gate transistor, the pulses comprising: a portion at a reference level, and a state fixation portion;
    a pin that is accessible from outside the memory;
    a control circuit for the state fixation pulse generation circuit, the control circuit having an input coupled to the pin, and adjusting the duration of the state fixation portion in real time as a function of an adjustment signal that is applied to the pin.

9. The memory according to claim 8, further comprising a signal control circuit having an input to which state fixation pulses are applied, the signal control circuit selectively applying the pulses to the gate or the drain of the floating gate transistor.

10. The memory according to claim 8, wherein the circuit for generating pulses comprises a capacitor charge and discharge circuit that charges and discharges a capacitor at constant current.

11. The memory according to claim 10, wherein the control circuit controls charging of the capacitor when the adjustment signal is applied, such that the state fixation pulse passes through a portion forming a ramp between the portion at a reference voltage and the state fixation portion.

12. The memory according to claim 11, wherein the control circuit controls discharging of the capacitor when the adjustment signal is no longer applied to the pin, such that the pulse changes from the state fixation portion to another portion at a reference voltage.

13. The memory according to claim 8, wherein the control circuit controls charging of the capacitor when the adjustment signal is applied, such that the state fixation pulse passes through a portion forming a ramp between the portion at a reference voltage and the state fixation portion.

14. The memory according to claim 8, wherein the control circuit controls discharging of the capacitor when the adjustment signal is no longer applied to the pin, such that the pulse changes from the state fixation portion to another portion at a reference voltage.

15. An information processing system including at least one non-volatile memory, the non-volatile memory comprising:
- at least one memory cell provided with a floating gate transistor;
- a circuit for generating pulses to fix the state of the floating gate transistor, the pulses comprising: a portion at a reference level, and a state fixation portion;
- a pin that is accessible from outside the memory;
- a control circuit for the state fixation pulse generation circuit, the control circuit having an input coupled to the pin, and adjusting the duration of the state fixation portion in real time as a function of an adjustment signal that is applied to the pin.

16. The information processing system according to claim 15, wherein the non-volatile memory further comprises a signal control circuit having an input to which state fixation pulses are applied, the signal control circuit selectively applying the pulses to the gate or the drain of the floating gate transistor.

17. The information processing system according to claim 15, wherein the circuit for generating pulses comprises a capacitor charge and discharge circuit that charges and discharges a capacitor at constant current.

18. The information processing system according to claim 17, wherein the control circuit controls charging of the capacitor when the adjustment signal is applied, such that the state fixation pulse passes through a portion forming a ramp between the portion at a reference voltage and the state fixation portion.

19. The information processing system according to claim 18, wherein the control circuit controls discharging of the capacitor when the adjustment signal is no longer applied to the pin, such that the pulse changes from the state fixation portion to another portion at a reference voltage.

* * * * *